United States Patent
Marumoto et al.

(10) Patent No.: US 8,249,259 B2
(45) Date of Patent: Aug. 21, 2012

(54) VOICE INTELLIGIBILITY ENHANCEMENT SYSTEM AND VOICE INTELLIGIBILITY ENHANCEMENT METHOD

(75) Inventors: Toru Marumoto, Iwaki (JP); Nozomu Saito, Iwaki (JP)

(73) Assignee: Alpine Electronics, Inc., Tokyo (JP)

(*) Notice: Subject to any disclaimer, the term of this patent is extended or adjusted under 35 U.S.C. 154(b) by 810 days.

(21) Appl. No.: 12/339,360

(22) Filed: Dec. 19, 2008

(65) Prior Publication Data

US 2009/0175459 A1 Jul. 9, 2009

(30) Foreign Application Priority Data

Jan. 9, 2008 (JP) ................................. 2008-002144

(51) Int. Cl.
*H04R 29/00* (2006.01)

(52) U.S. Cl. ............... 381/56; 381/57; 381/58; 381/59; 381/86; 381/94.1; 381/95; 381/96; 381/104; 381/107; 381/108; 381/318

(58) Field of Classification Search ................. 381/94.1, 381/86, 317, 318, 57, 56, 58, 59, 104, 107, 381/108, 95, 96

See application file for complete search history.

(56) References Cited

U.S. PATENT DOCUMENTS

| 4,891,605 | A | 1/1990 | Tirkel |
| 5,615,270 | A | 3/1997 | Miller et al. |
| 6,094,481 | A * | 7/2000 | Deville et al. ............ 379/388.03 |
| 2005/0195994 | A1 | 9/2005 | Saito et al. |
| 2008/0310652 | A1* | 12/2008 | Gustavsson ................. 381/106 |

FOREIGN PATENT DOCUMENTS

JP  11-166835  6/1999

* cited by examiner

*Primary Examiner* — Tan N Tran

(74) *Attorney, Agent, or Firm* — Brinks Hofer Gilson & Lione

(57) ABSTRACT

In a voice intelligibility enhancement system that controls a gain of a voice signal based on noise power and voice power of the voice signal generated by a voice signal generation unit, it is detected whether the voice power is equal to or greater than a predetermined level, noise power output when the voice power is less than the predetermined level is measured and stored, noise power to be output when the voice power exceeds the predetermined level is estimated to be the stored noise power, and gain of a voice signal is controlled on the basis of the voice power and the estimated noise power.

9 Claims, 8 Drawing Sheets

VOICE INTELLIGIBILITY ENHANCEMENT SYSTEM AND VOICE INTELLIGIBILITY ENHANCEMENT METHOD

RELATED APPLICATIONS

The present application claims priority to Japanese Patent Application Serial Number 2008-002144, filed Jan. 9, 2008, the entirety of which is hereby incorporated by reference.

FIELD OF THE INVENTION

The present invention relates to voice intelligibility enhancement systems and voice intelligibility enhancement methods, and in particular, relates to a voice intelligibility enhancement system and a voice intelligibility enhancement method for controlling a gain of a voice signal based on noise power and a voice power of the voice signal generated by a voice signal generation unit.

BACKGROUND OF THE INVENTION

An in-vehicle voice intelligibility enhancement system is available. In the in-vehicle voice intelligibility enhancement system, voice output from a speaker (for example, navigation guidance voice and voice in which, for example, news or a mail is spoken) is made clearly audible even in a noisy environment. For example, in an in-vehicle navigation device, voice for, e.g., course guidance is output from a speaker to a passenger compartment. When noise such as an engine sound or road noise is large because, for example, a vehicle is driving, it becomes difficult to hear voice output from a speaker due to masking effect. Thus, when noise is large in relation to voice output from a speaker, for example, the gain of the entire voice band is increased by performing loudness compensation on the voice output from the speaker so as to make the voice output from the speaker clearly audible even in a noisy environment.

FIG. 8 is a block diagram of a known voice intelligibility enhancement system (see, for example, Japanese Unexamined Patent Application Publication No. 11-166835). Referring to FIG. 8, an identification filter 1 simulates a guidance voice signal at a position where a microphone 2 is disposed, and then a subtracter 3 subtracts the signal from the output of the microphone 2 to extract a noise signal. A loudness compensation gain calculation unit 4 calculates Gopt on the basis of each of the guidance voice signal and the noise signal and inputs Gopt to a route guidance (RG) compensation unit 5.

In this case, an identification process in an identification filter 6 is performed using an adaptive filter 7. An adaptive algorithm unit 8 in the adaptive filter 7 may be implemented using various types of adaptive algorithms. Typical adaptive algorithms include the Least Mean Squares (LMS) algorithm. Filter coefficients may be updated using, for example, the Fast-LMS algorithm (the LMS algorithm in the frequency domain).

The aforementioned known voice intelligibility enhancement system has many problems. A first problem is that, when an estimation error (deviation from an ideal state: $\alpha$) occurs in a power of a voice signal, since a sign of the error of the estimated noise power calculated by the subtraction is opposite to the sign of the error $\alpha$ of the estimated power of the voice signal, as shown in the following equation:

[E1]

$$\text{Estimated Power of Voice Signal:} \hat{P}_S \approx \Sigma(s(t)+\alpha)^2$$

$$\text{Estimated Power of Noise:} \hat{P}_N \approx \Sigma(n(t)-\alpha)^2 \quad (1)$$

the gain cannot be correctly determined because the error range becomes large.

Specifically, when an estimation error (deviation from an ideal state: $\alpha$) occurs in a voice signal, an error of $-\alpha$ occurs in estimation of a noise. As a result, a gain value calculated from these power values deviates noticeably from an ideal value to affect the effect of compensation. For example, when both of the estimated powers of noise and voice are 70 dBA, an ideal compensation gain value is 5.9 dB. In this case, when the estimated value of the voice has an error of about 5 dB (resulting in 65 dBA), the estimated value of the noise increases to 75 dBA accordingly, so that the gain value increases to 9.9 dB. When the estimated value of the noise stays at 70 dBA, the gain value is 7.6 dB. Thus, the error of the gain is small.

A second problem is that an expensive digital signal processor (DSP) is necessary because the amount of calculation is too large in the known voice intelligibility enhancement system. In the case of the known voice intelligibility enhancement system, even when the adaptive algorithm unit 8 shown in FIG. 8 is implemented using the Fast-LMS algorithm in which the amount of calculation is said to be relatively small, a fast Fourier transform (FFT) needs to be performed twice for each unit signal block length, and filter coefficients need to be updated. Moreover, since this processing includes calculation of complex numbers, multiplication needs to be performed a little under 19000 times in a DSP, and thus a computational power of about 20 MIPS is necessary in a DSP. The amount of processing for the calculation occupies about eighty percent of the entire amount of processing in a DSP necessary to implement the known voice intelligibility enhancement system. Thus, a problem arises in that an expensive DSP is necessary to implement the known voice intelligibility enhancement system shown in FIG. 8, and accordingly, the computational power of the DSP cannot be sufficiently allocated to the other processing. In this case, assuming that window length N=1024 when an FFT is performed, the number of multiplication is $$N \log_2 N + N/2 \times 17 = 18944.$$

Accordingly, it is an object of the present invention to enable correct estimation of noise power, in particular, even when an error occurs in an estimation of voice power, to prevent the error from affecting the estimation of noise power.

It is another object of the present invention to reduce the number of calculations performed in a voice intelligibility enhancement system.

SUMMARY OF THE INVENTION

A voice intelligibility enhancement system according to a first aspect of the present invention is provided. The voice intelligibility enhancement system is mounted in a vehicle and controls a ginal of a voice signal based on noise power and a voice power of a voice signal generated by a voice signal generation unit. The voice intelligibility enhancement system includes a voice power detection unit that detects whether the voice power is equal to or greater than a predetermined level, a noise power measurement unit that measures noise power, a noise power storage unit that stores noise power output when the voice power is less than the predetermined level, and a gain control unit that controls the gain of a voice signal, wherein the gain control unit estimates noise power to be output when the voice power exceeds the predetermined level to be the stored noise power.

The voice intelligibility enhancement system may further include a transmission characteristics identification unit that, in identification mode available when a vehicle is stopped, identifies characteristics of transmission from a speaker that outputs voice to a microphone that detects noise, and a transmission characteristics application unit that, in normal operation mode, applies the characteristics of transmission to the voice power to output voice power at a position of the microphone. The gain control unit may control gain of a voice signal based on the voice power output from the transmission characteristics application unit and the estimated noise power.

In the identification mode, the transmission characteristics identification unit may identify the characteristics of transmission by approximating the characteristics of transmission by gain, and in the normal operation mode, the transmission characteristics application unit may multiply the voice power by the gain to output the voice power at the position of the microphone.

The voice intelligibility enhancement system may further include a microphone power measurement unit that measures power of a signal detected by the microphone, and a simulated voice signal generation unit that generates a simulated voice signal in the identification mode. In the identification mode, the transmission characteristics identification unit may measure power of the simulated voice signal output from the simulated voice signal generation unit and identify the gain from a ratio of the power output from the microphone power measurement unit to the power of the simulated voice signal.

The voice intelligibility enhancement system may further include a first averaging unit that averages the power of the simulated voice signal for predetermined time, and a second averaging unit that averages the power of the signal detected by the microphone for predetermined time. The transmission characteristics identification unit may identify the gain from a ratio of the average power of the signal detected by the microphone output from the second averaging unit to the average power of the simulated voice signal output from the first averaging unit.

The noise power storage unit may average, for predetermined time, the noise power output when the voice power is less than the predetermined level and store the average noise power.

The noise power storage unit may store an average of noise power for last predetermined time obtained by a moving average method.

The voice intelligibility enhancement system may further include a mode switching unit that switches between the identification mode and the normal operation mode.

When the voice signal is a voice signal corresponding to voice uttered by a man, the simulated voice signal generation unit may generate a simulated male voice signal, and when the voice signal is a voice signal corresponding to voice uttered by a woman, the simulated voice signal generation unit may generate a simulated female voice signal.

The voice intelligibility enhancement system may further include a unit that enables and disables operation of the voice intelligibility enhancement system, and a unit that, when the operation of the voice intelligibility enhancement system is enabled, checks whether the characteristics of transmission have ever been identified, when the characteristics of transmission have been identified, starts the operation of the voice intelligibility enhancement system, and when the characteristics of transmission have never been identified, prompts a user to determine whether to turn on the identification mode and identify the characteristics of transmission.

A voice intelligibility enhancement method according to a second aspect of the present invention in a voice intelligibility enhancement system that is mounted in a vehicle and controls a gain of a voice signal based on noise power and a voice power of the voice signal generated by a voice signal generation unit. The voice intelligibility enhancement method includes (a) detecting whether the voice power is equal to or greater than a predetermined level, (b) measuring and storing noise power output when the voice power is less than the predetermined level, (c) estimating noise power to be output when the voice power exceeds the predetermined level to be the stored noise power, and (d) controlling gain of a voice signal on the basis of the voice power and the estimated noise power.

The voice intelligibility enhancement method may further include, in identification mode available when a vehicle is stopped, identifying characteristics of transmission from a speaker that outputs voice to a microphone that detects noise, and in normal operation mode, applying the characteristics of transmission to the voice power to output voice power at a position of the microphone. In step (d), gain of a voice signal may be controlled on the basis of the voice power at the position of the microphone and the estimated noise power.

In the identification mode, the characteristics of transmission may be identified by approximating the characteristics of transmission by gain, and in the normal operation mode, the voice power may be multiplied by the gain to output the voice power at the position of the microphone.

The voice intelligibility enhancement method may further include generating a simulated voice signal in the identification mode, measuring power of the simulated voice signal and power of a signal detected by the microphone, and identifying the gain from a ratio of the power of the signal detected by the microphone to the power of the simulated voice signal. The voice intelligibility enhancement method may further include averaging the power of the simulated voice signal for predetermined time, and averaging the power of the signal detected by the microphone for predetermined time. The gain may be identified from a ratio of the average power of the signal detected by the microphone to the average power of the simulated voice signal.

When noise power is calculated, typically voice power is not subtracted from the power of a signal detected by a microphone (the power of a sound in which noise and voice are mixed). Thus, the noise power does not include the correlation between a voice signal and a noise signal. Accordingly, even when the correlation between voice and noise becomes high, the estimation error of the noise power can be minimized. Moreover, even when an estimation error occurs in voice power, the error can be completely prevented from affecting the estimated value of noise power, and the gain of a voice signal can be prevented from having a significant error.

Moreover, according to the present invention, since, for example, an FFT or the complex Fast-LMS algorithm need not be performed, the amount of calculation in a voice intelligibility enhancement system can be noticeably reduced.

BRIEF DESCRIPTION OF THE DRAWINGS

FIG. 5 shows the flow of control process in a case where a voice intelligibility enhancement switch is turned on;

DESCRIPTION OF THE PREFERRED EMBODIMENTS

As described below, in some implementations, when a voice, such as a guidance voice, is not output, a noise power is calculated and stored as a stored noise power for use at a later time, such as when a voice is output. Even when noise power is estimated in this manner, since a period of time when no guidance voice is output frequently occurs, noise power calculated in the last period of time in which no guidance voice is output can be adopted as noise power output while voice is output, and thus the estimation error of the noise power is small.

Moreover, the characteristics of acoustic transmission from a speaker to the position of a microphone are approximated by gain G, and voice power at the position of the microphone is estimated by multiplying the square of the amplitude of a guidance voice signal (power) by the gain G.

In the present invention, in this manner, voice power $\hat{P}_S$ and noise power $\hat{P}_N$ are calculated independently by the following equations:

[E2]

$$\hat{P}_S \approx G \Sigma s(t)^2$$

$$\hat{P}_N \approx \Sigma n(t-\phi)^2 \qquad (2)$$

Thus, since, unlike the known art, noise power is not estimated by a subtraction process, even when an estimation error occurs in voice power, the error can be prevented from affecting the estimated value of noise power. Moreover, in the present invention, since acoustic transmission characteristics are approximated by the gain G, the amount of calculation in a voice intelligibility enhancement system can be noticeably reduced.

Figure 1:
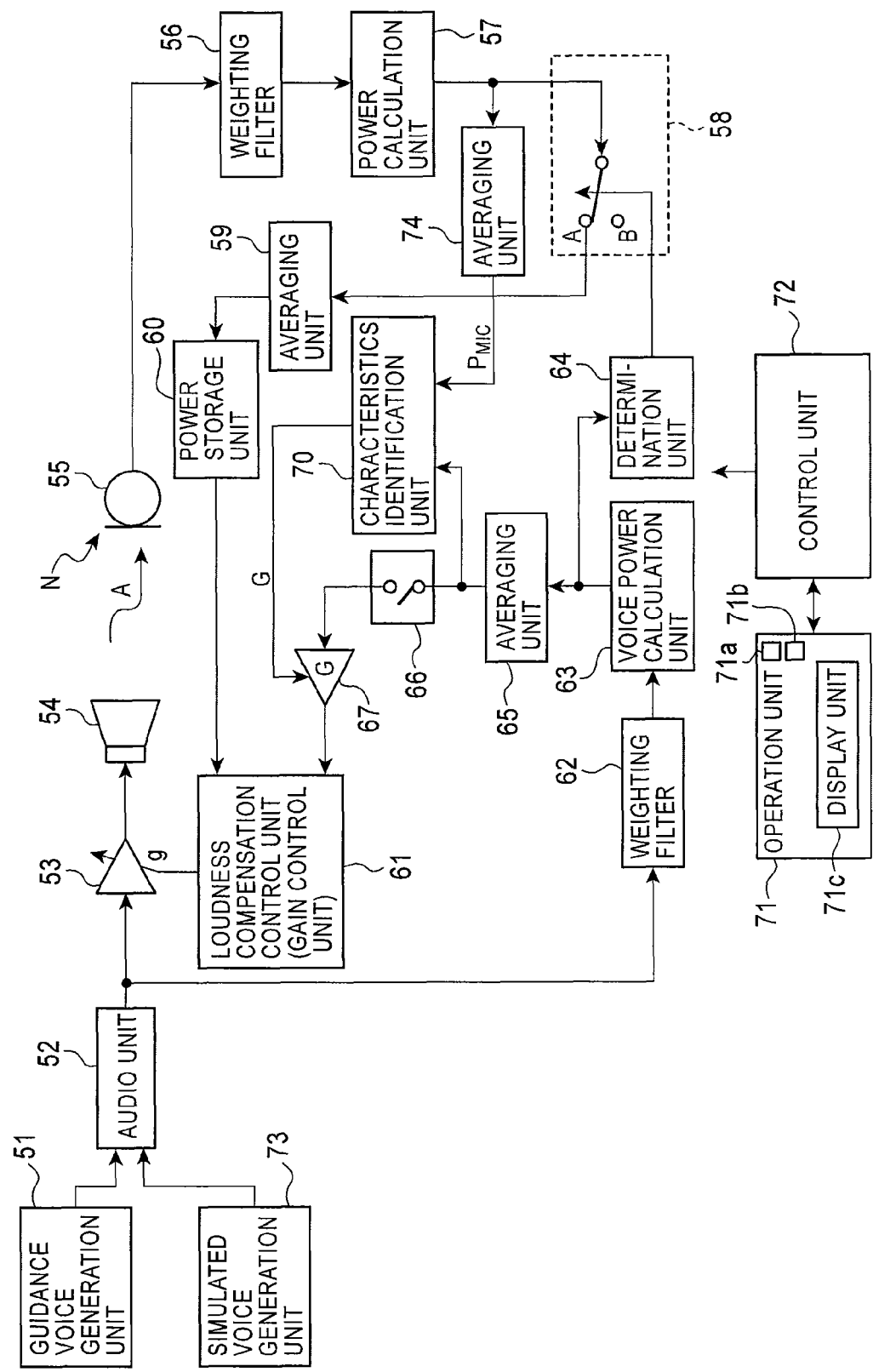
FIG. 1 is a block diagram of an embodiment of a voice intelligibility enhancement system.

FIG. 1 is a block diagram of one embodiment of a voice intelligibility enhancement system. In normal operation, a guidance voice generation unit 51 in a navigation device generates a guidance voice signal, for example, when approaching an intersection. An audio unit 52 performs, for example, tone and volume control on the guidance voice signal and amplifies the guidance voice signal to output the guidance voice signal. A gain adjustment unit (volume compensation unit) 53 performs volume compensation on the voice signal output from the audio unit 52 by multiplying the voice signal by the gain G determined in a loudness compensation control unit (gain control unit) 61 described below to input the compensated voice signal to a speaker 54. The speaker 54 performs electric-acoustic conversion on the input voice signal to output guidance voice to a passenger compartment. A microphone 55 detects a sound in which guidance voice A and ambient noise N (for example, an engine sound or road noise) are mixed and inputs the detected sound to a power calculation unit 57 via a weighting filter 56. The power calculation unit 57 calculates power by squaring the amplitude of the input signal detected by the microphone 55 and inputs the power to a switching unit 58.

When no guidance voice is output, i.e., when the power of a voice signal (voice power) is smaller than a predetermined value, the switching unit 58 inputs the power calculated by the power calculation unit 57 to a noise power averaging unit 59 via a fixed contact A. On the other hand, when guidance voice is output, i.e., when voice power is larger than the predetermined value, the switching unit 58 outputs the power calculated by the power calculation unit 57 to the side of a contact B so as not to input the power to any unit.

When no guidance voice is output, the noise power averaging unit 59 determines the power output from the power calculation unit 57 as being noise power, obtains the moving average of the last 256 power values output from the power calculation unit 57, and then stores the moving average as noise power in a power storage unit 60. As a result, when guidance voice is output, the last noise power in the last section in which no guidance voice is output is stored in the power storage unit 60. In the present invention, noise power to be output while guidance voice is output is considered as the noise power stored in the power storage unit 60, and the noise power stored in the power storage unit 60 is input to the gain control unit 61.

Concurrently with the aforementioned process, the voice signal output from the audio unit 52 is also input to a voice power calculation unit 63 via a weighting filter 62. The voice power calculation unit 63 calculates voice power by squaring the amplitude of the input voice signal and inputs the voice power to a determination unit 64 and a voice power averaging unit 65. The determination unit 64 compares the input voice power with a predetermined level. When the voice power is smaller than the predetermined level, the determination unit 64 determines that the current section is a section in which no guidance voice is output. On the other hand, when the voice power is larger than the predetermined level, the determination unit 64 determines that the current section is a section in which guidance voice is output. Then, when no guidance voice is output, the determination unit 64 controls the switching unit 58 so as to input the power calculated by the power calculation unit 57 to the noise power averaging unit 59. When guidance voice is output, the determination unit 64 controls the switching unit 58 so as not to input the power to any unit.

The voice power averaging unit 65 calculates the average of 1024 voice power values output from the voice power calculation unit 63 and inputs the average to a variable gain unit 67 via a switch 66 that is usually on. The variable gain unit 67 multiplies the average voice power by the set gain G and inputs the product to the gain control unit 61. In this case, assuming that the characteristics of transmission from the input terminal of the speaker 54 to the output terminal of the microphone 55 can be approximated only by gain, the gain G set in the variable gain unit 67 is identified and set in identification mode described below in advance by a characteristics identification unit 70.

When guidance voice is output, the loudness compensation control unit 61 determines, on the basis of the voice power input from the variable gain unit 67 and the noise power input from the power storage unit 60, the gain G, which makes guidance voice clearly audible regardless of the level of noise, from the loudness characteristics of humans and inputs the determined gain G to the gain adjustment unit 53. The gain adjustment unit 53 multiplies a guidance voice signal by the gain G upon receiving the gain G and outputs the product. In this case, when no guidance voice is output, the loudness compensation control unit 61 does not perform control for determining the gain G.

Figure 2:
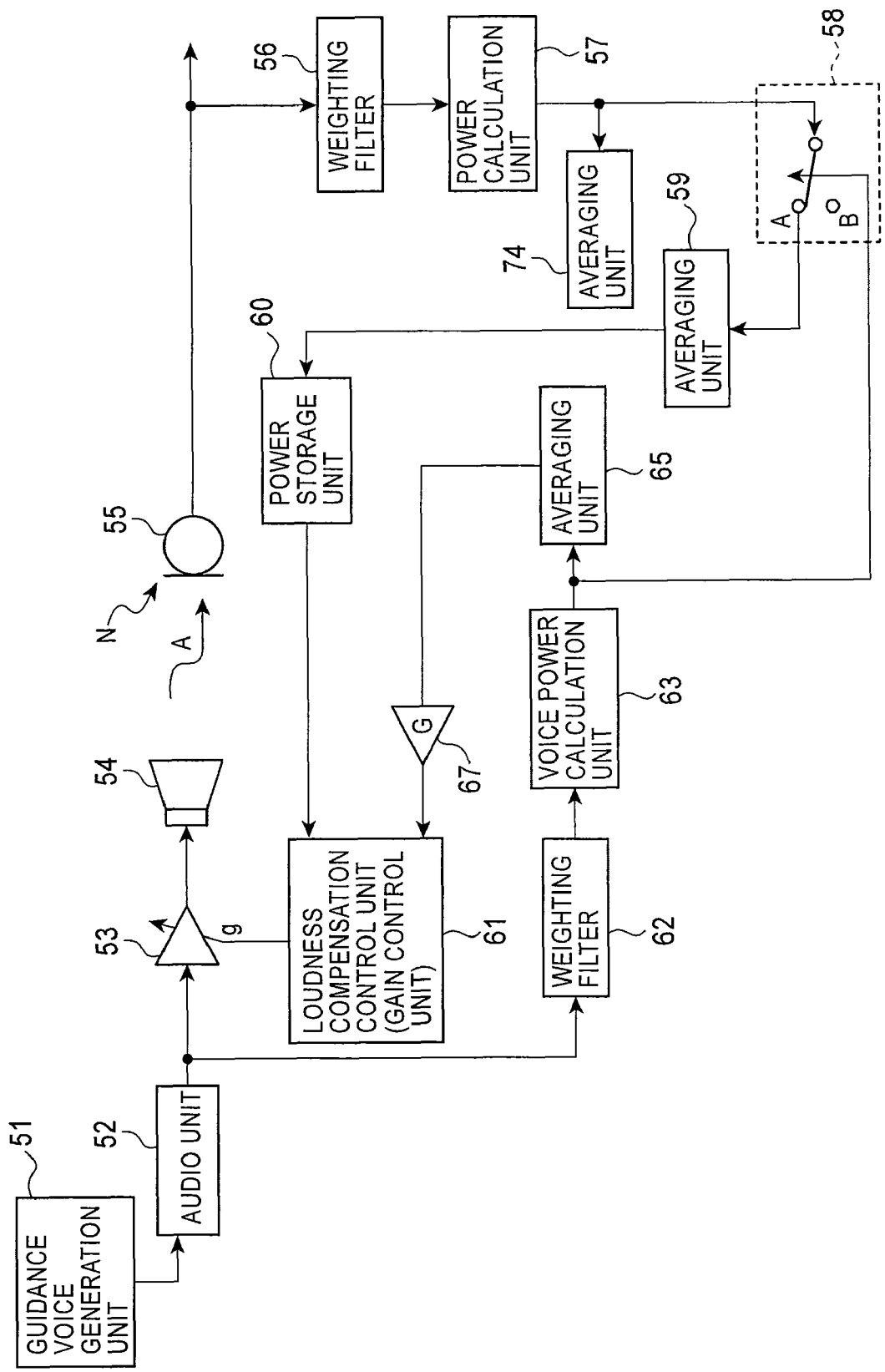
FIG. 2 is a block diagram showing units that operate when voice intelligibility is enhanced.

FIG. 2 is a block diagram showing units that operate when voice intelligibility is enhanced. In the aforementioned case, the gain G, which approximates the characteristics of transmission from the input terminal of the speaker 54 to the output terminal of the microphone 55, is identified, and a voice intelligibility enhancement switch 71a in an operation unit 71 is on. However, when the voice intelligibility enhancement switch 71a is off, the control unit 72 controls the loudness compensation control unit 61 so as not to perform voice intelligibility enhancement control.

Even in a case where the voice intelligibility enhancement switch 71a in the operation unit 71 is on, when the gain G is not identified, the control unit 72 does not perform voice intelligibility enhancement control. However, when the gain G is not identified, the control unit 72 displays, upon detecting that a vehicle is parked, a message prompting a user to determine whether to identify the gain G on a display unit 71c. When the user selects the identification mode with a mode selection switch 71b, the control unit 72 starts to identify the gain G.

Specifically, when the mode is set to the identification mode, the control unit 72 drives a simulated voice generation unit 73 to output simulated voice, stops gain determination control by the loudness compensation control unit 61, turns off the switch 66, enables the characteristics identification unit 70, and then gives an instruction to start to identify the gain G.

In the identification process, the simulated voice generation unit 73 generates simulated voice and inputs a signal of the simulated voice to the speaker 54 via the audio unit 52 and the gain adjustment unit (volume compensation unit) 53. The speaker 54 performs electric-acoustic conversion on the input voice signal to output guidance voice to a passenger compartment. The microphone 55 detects the guidance voice A (the noise N is zero) and inputs the guidance voice A to the power calculation unit 57 via the weighting filter 56. The power calculation unit 57 calculates power by squaring the amplitude of the input signal detected by the microphone 55 and inputs the power to a power averaging unit 74. The power calculation unit 57 calculates the average $P_{MIC}$ of 1024 power values input from the power calculation unit 57 and inputs, to the characteristics identification unit 70, the average $P_{MIC}$ as voice power at the position of the microphone 55.

Concurrently with the aforementioned process, the voice signal output from the audio unit 52 is input to the voice power calculation unit 63 via the weighting filter 62. The voice power calculation unit 63 calculates voice power by squaring the amplitude of the input voice signal and inputs the voice power to the voice power averaging unit 65. The voice power averaging unit 65 calculates the average $P_{AUD}$ of 1024 voice power values output from the voice power calculation unit 63 and inputs the average $P_{AUD}$ to the characteristics identification unit 70.

The characteristics identification unit 70 calculates the gain G by the following equation:

$$G = P_{MIC}/P_{AUD} \qquad (3)$$

and determines the gain G as approximating the characteristics of transmission from the input terminal of the speaker 54 to the output terminal of the microphone 55 to set the gain G in the variable gain unit 67. That is, in the present invention, in view of the fact that transmission characteristics can be approximated substantially evenly across the frequency band of navigation voice, transmission characteristics are substituted with the gain G. When the gain G is identified, in normal mode in which the voice intelligibility enhancement switch 71a is on, voice intelligibility enhancement control is performed as described above.

Figure 3:
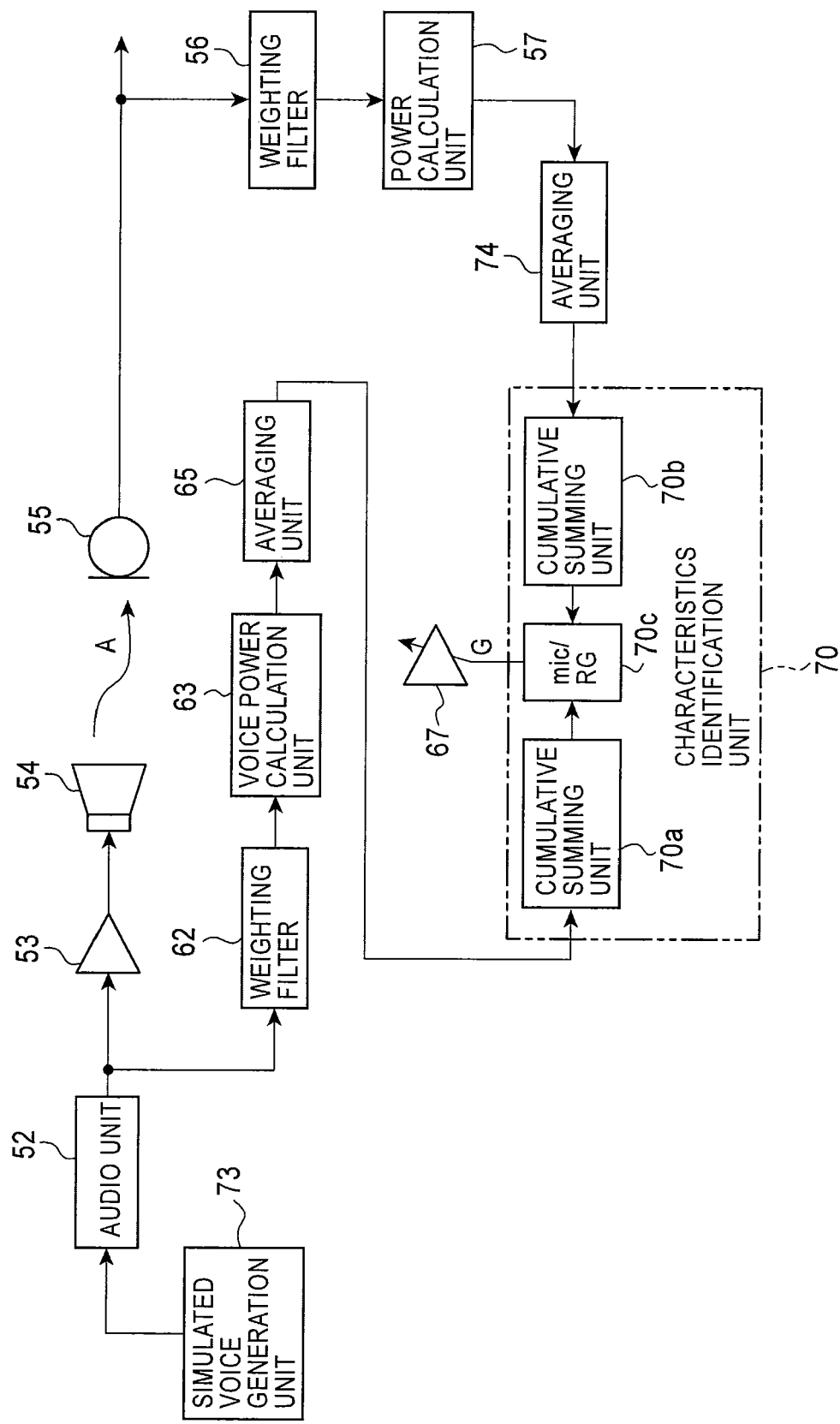
FIG. 3 is a block diagram showing units that operate in an identification process.

FIG. 3 is a block diagram showing units that operate in the identification process. The characteristics identification unit 70 includes a cumulative summing unit 70a that cumulatively sums the average $P_{AUD}$ of voice power values input from the voice power averaging unit 65, a cumulative summing unit 70b that cumulatively sums the average $P_{MIC}$ of power values input from the power averaging unit 74, and a dividing unit 70c that calculates gain according to equation (3).

Figure 4:
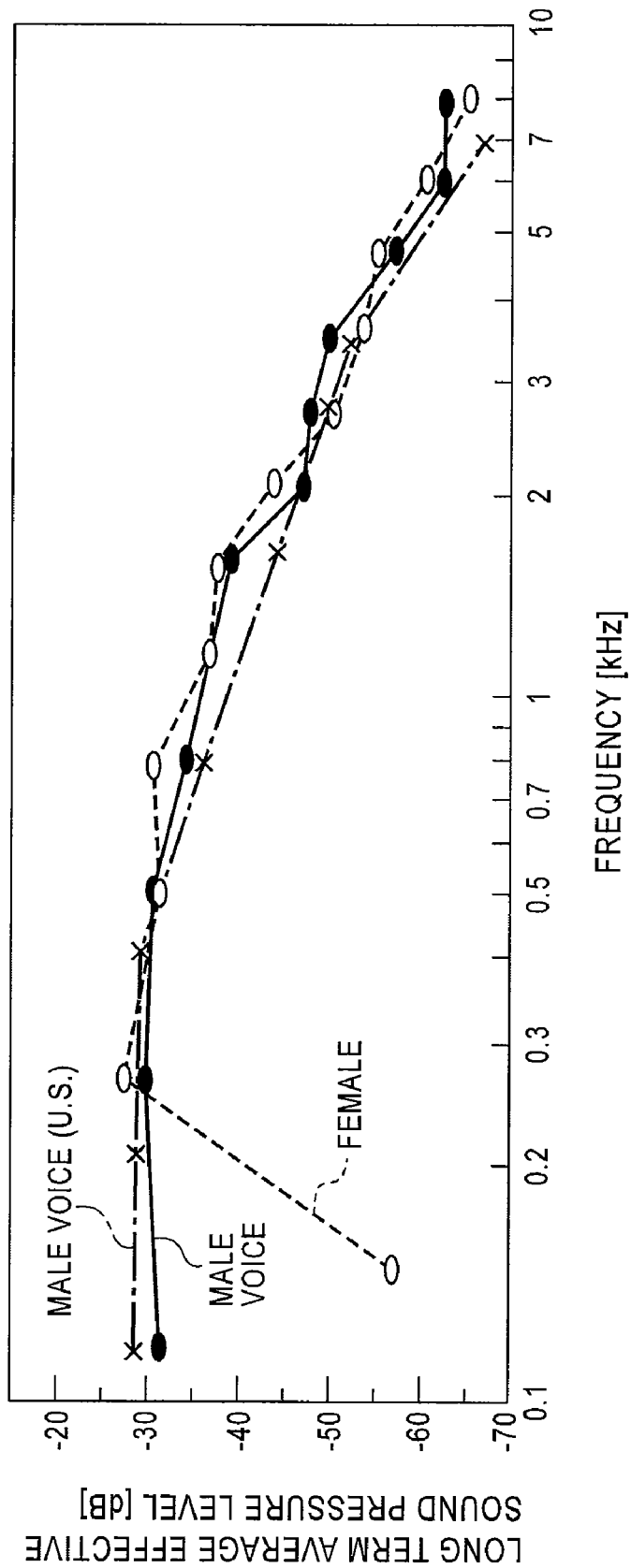
FIG. 4 is a characteristic chart of simulated voice in which the average of the distributions of speech spectra is simulated.

Simulated voice in which the average of the distributions of speech spectra as shown in FIG. 4 is simulated is used as simulated voice source used in the identification process. In this case, when a guidance voice signal is a male voice signal, a simulated male voice signal is used, and when a guidance voice signal is a female voice signal, a simulated female voice signal is used. FIG. 4 is excerpted from Miura and Koshikawa, *Onsei No Shunji Reberu Bunpu Oyobi Supekutoru*, Tsuuken Jippou 4.2, pp. 245-262 (1955).

Figure 5:
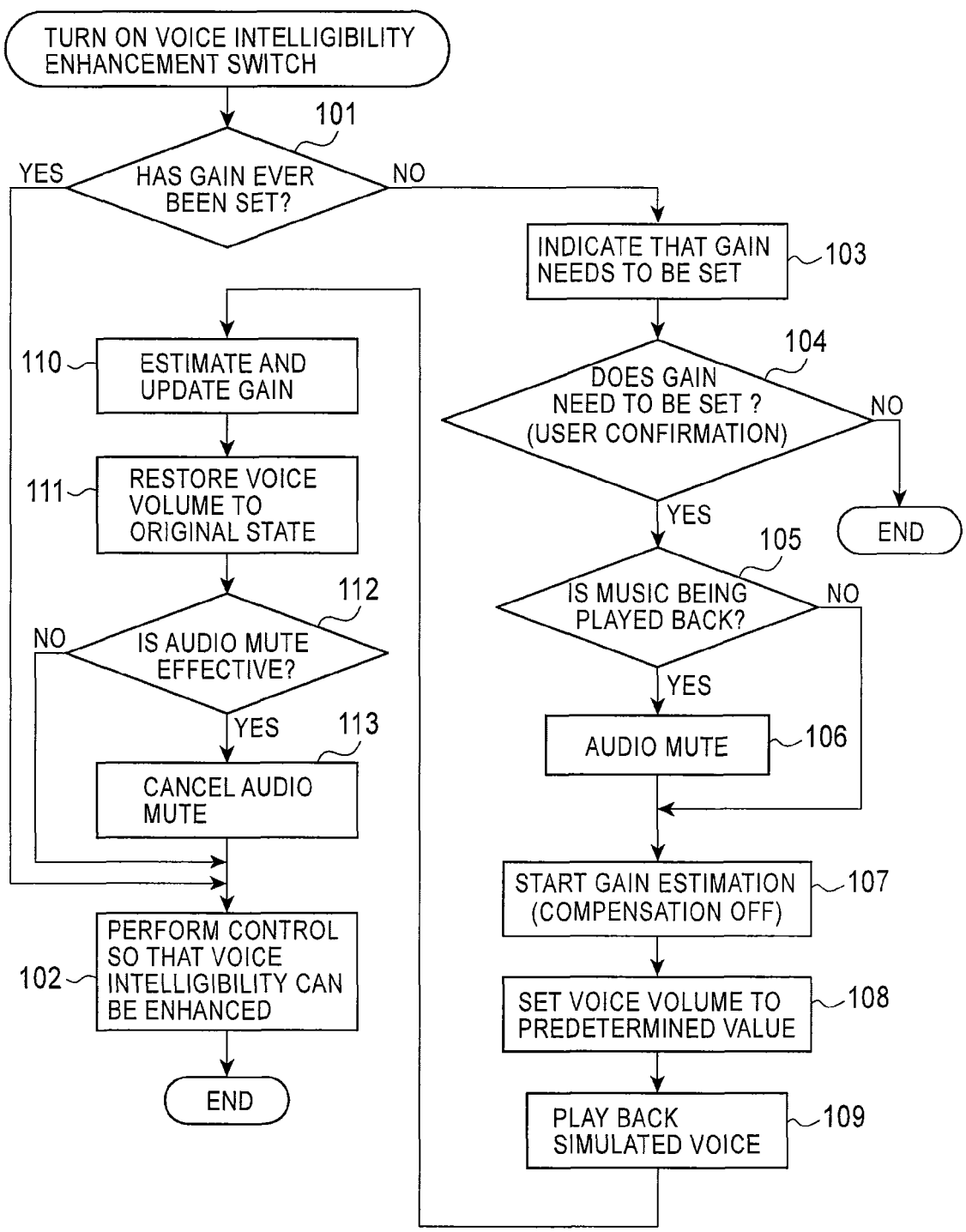

FIG. 5 is a flow chart of one embodiment of a control process in a case where the voice intelligibility enhancement switch 71a is turned on. When the voice intelligibility enhancement switch 71a has been turned on, in step 101, the control unit 72 checks whether the gain G has ever been set. When the control unit 72 determines that the gain G has been set, in step 102, the control unit 72 controls relevant components so that voice intelligibility enhancement can be performed and then starts voice intelligibility enhancement.

On the other hand, when the control unit 72 determines in step 101 that the gain G has never been set, in step 103, the control unit 72 displays, on the display unit 71c, a message stating that gain needs to be identified. In this case, it is assumed that a vehicle is parked.

In step 104, the control unit 72 determines whether a user has selected the identification mode before predetermined time elapses after displaying the message. When the control unit 72 determines that the user has not selected the identification mode before the predetermined time elapses after displaying the message, the control unit 72 completes the process and does not perform voice intelligibility enhancement control. On the other hand, when the user has selected the identification mode by operating the mode selection switch 71b, the process proceeds to step 105. In step 105, the control unit 72 checks whether music is being played back. When music is being played back, in step 106, playback sounds are muted. Subsequently, in step 107, the control unit 72 stops gain determination control by the loudness compensation control unit 61 (compensation off, enables the characteristics identification unit 70, and then gives an instruction to start to identify the gain G.

Then, in step 108, the control unit 72 sends, to the audio unit 52, an instruction to set voice volume to a predetermined value, and in step 109, the control unit 72 drives the simulated voice generation unit 73 to output simulated voice. In this state, in step 110, the characteristics identification unit 70 starts the aforementioned identification process and determines the gain G to set the gain G in the variable gain unit 67. After the control unit 72 sets the gain G, in step 111, the control unit 72 indicates the audio unit 52 to restore the voice volume to the original state. Then, in step 112, the control unit 72 determines whether audio mute is effective. When control unit 72 determines that audio mute is effective, in step 113, the control unit 72 cancels audio mute. Subsequently, in step 102, the control unit 72 controls the relevant components so that voice intelligibility enhancement can be performed and then starts voice intelligibility enhancement.

In the identification process, unless it is determined upon detecting a parking signal that a vehicle is stopped, operation is disabled. After the gain is identified, the identified gain is stored until the gain is set again. The process flow shown in FIG. 5 is applicable to a case where the gain G has never been set. When the gain G is set again, after the identification mode is turned on while a vehicle is stopped, the gain G is updated, following step 105 and subsequent steps shown in FIG. 5.

According to the embodiment, in a section in which no guidance voice is output, noise power is calculated and stored, and noise power to be output while voice is output is considered as the stored noise power. Moreover, the characteristics of acoustic transmission from a speaker to the position of a microphone are approximated by the gain G, and voice power at the position of the microphone is estimated by multiplying the square of the amplitude of a guidance voice signal (power) by the gain G. As a result, unlike the known art, when noise power is calculated, voice power is not subtracted from the power of a signal detected by a microphone (the power of a sound in which noise and voice are mixed). Thus, the noise power does not include the correlation between a voice signal and a noise signal. Accordingly, even when the correlation between voice and noise becomes high, the estimation error of the noise power can be minimized. Even when noise power is estimated in the aforementioned manner, since a section in which no guidance voice is output frequently occurs, the estimation error of noise power output while voice is output can be minimized.

Moreover, even when an estimation error occurs in voice power, the error can be prevented from affecting the estimated value of noise power, and the gain of a voice signal can be prevented from having a significant error. Even when an error (deviation from an ideal state: α) occurs in the estimated value of voice power, since an independent power estimation mechanism according to the embodiment is provided, no subtraction process is performed. Thus, a gain value calculated from these power values does not deviate noticeably from an ideal value. For example, when both of the respective estimated values of noise power and voice power are 70 dBA, an ideal compensation gain value is 5.9 dB. In this case, even when the estimated value of the voice power has an error of about 5 dB (resulting in 65 dBA), the estimated value of the noise power stays at 70 dBA, so that the gain value can be kept at 7.6 dB (in the case of the known art, 9.9 dB).

Figure 6:
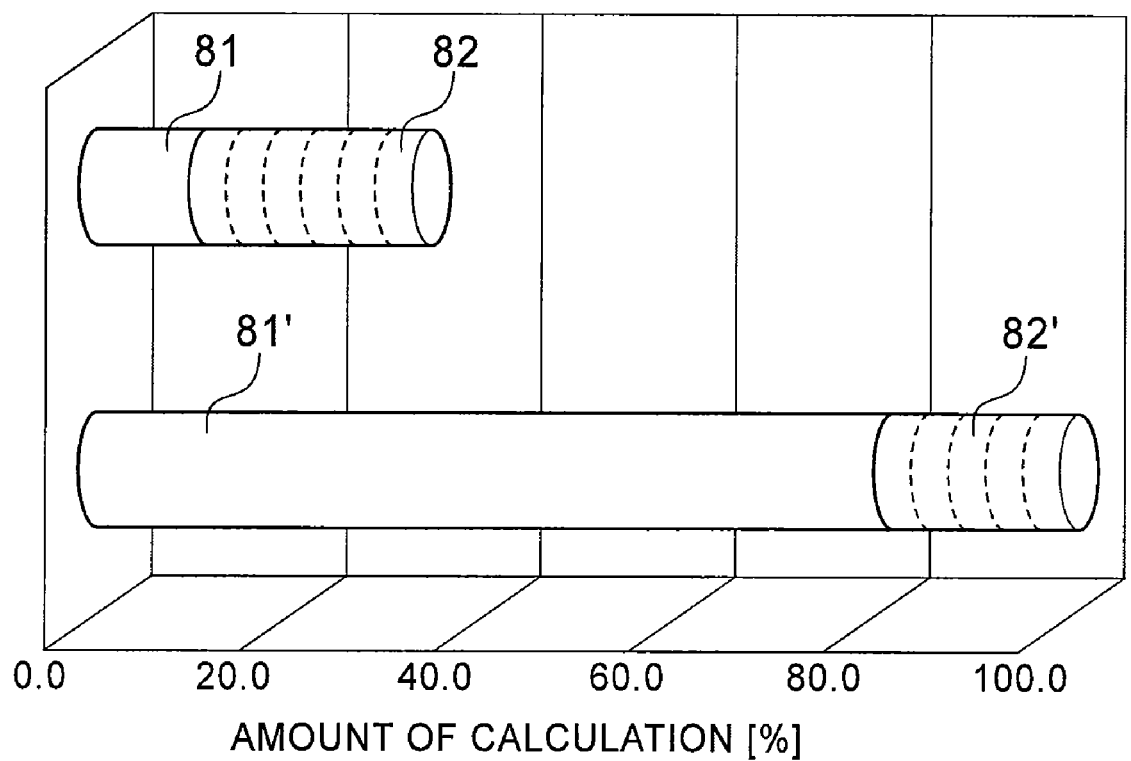
FIG. 6 shows an advantageous effect of the present invention.

According to the embodiment, since, for example, a FFT or the complex Fast-LMS algorithm need not be performed, the amount of calculation in a voice intelligibility enhancement system can be noticeably reduced. Specifically, the number of multiplication necessary for noise estimation in each section is 3000, and thus, regarding noise estimation, the same performance can be achieved with about 15% of the amount of processing in the known art. When a voice intelligibility enhancement system according to the embodiment of the present invention and a known voice intelligibility enhancement system are installed in the same environment and evaluated, the result of evaluation is as shown in FIG. 6. Specifically, in normal operation, in the voice intelligibility enhancement system according to the embodiment, regarding noise estimation, 85% of the amount of processing necessary in the known voice intelligibility enhancement system is reduced, as expected, and regarding the overall calculation, two thirds of the amount of processing necessary in the known voice intelligibility enhancement system is reduced. The horizontal axis in FIG. 6 indicates the proportion of MIPS necessary in the voice intelligibility enhancement system according to the embodiment, assuming MIPS necessary in the known voice intelligibility enhancement system to be 100%. Reference numerals 81 and 82 respectively denote the amount of noise estimation calculation and the amount of other calculation in the voice intelligibility enhancement system according to the embodiment, and reference numerals 81' and 82' respectively denote the amount of noise estimation calculation and the amount of other calculation in the known voice intelligibility enhancement system.

Figure 7:
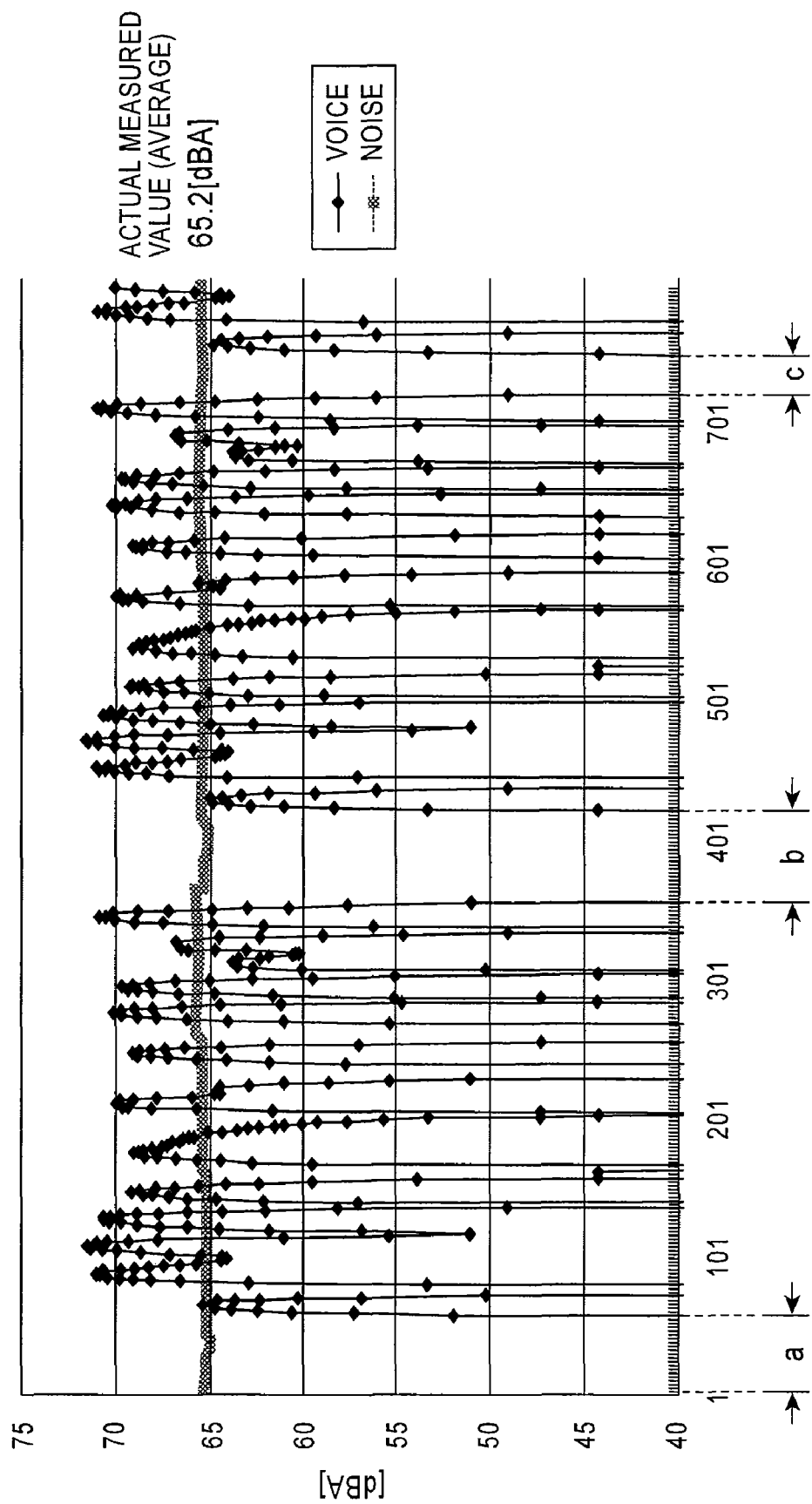
FIG. 7 shows the accuracy of noise estimation in the present invention.
Figure 8:
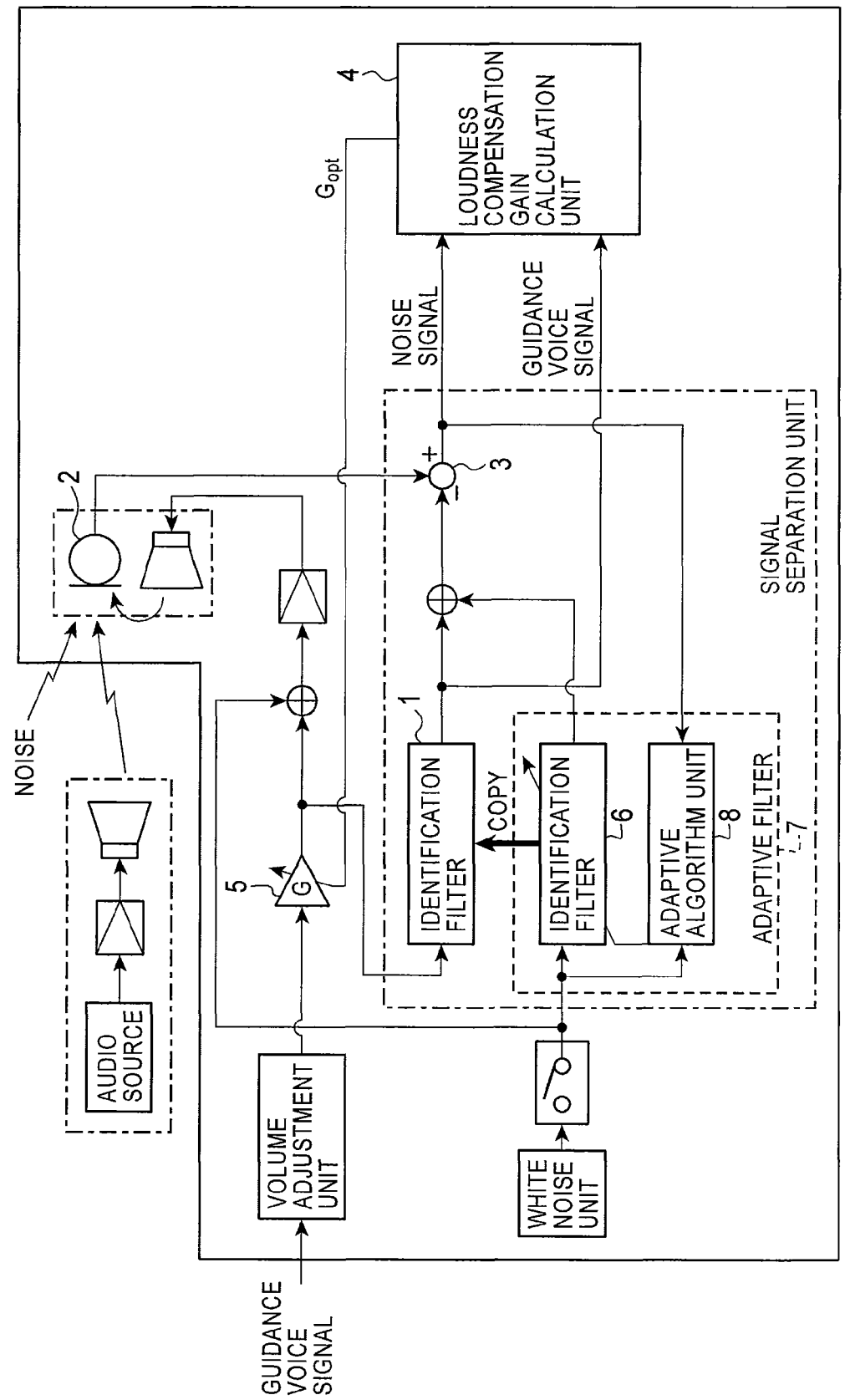
FIG. 8 is a block diagram of a known voice intelligibility enhancement system.

FIG. 7 shows the approximate accuracy of noise estimation in the present invention. It can be found that the actual measured value is 65.2 dBA, and noise power is almost accurately estimated in the present invention. In FIG. 7, reference letters a, b, and c denote respective sections in which no guidance voice is output.

According to the present invention, the costs of DSP devices can be reduced, and the range of applicable models can be expanded.

In some implementations, the characteristics of transmission from a speaker input terminal to a microphone output terminal are approximated by the gain G. In other implementations, although the amount of calculation increases, in the identification mode, the characteristics of transmission may be obtained using the LMS algorithm or the Fast-LMS algorithm, and in voice intelligibility enhancement control, the characteristics of transmission may be applied to voice power to be input to the loudness compensation control unit 61.

While a case where the intelligibility of guidance voice is controlled has been described, the present invention is not limited to such a case where the intelligibility of guidance voice is enhanced but can also be applied to a case where the voice intelligibility of voice in which, for example, news or a mail is spoken, or another type of voice is enhanced. It is therefore intended that the foregoing detailed description be regarded as illustrative rather than limiting, and that it be understood that it is the following claims, including all equivalents, that are intended to define the spirit and scope of this invention.

What is claimed is:

1. A voice intelligibility enhancement system that is mounted in a vehicle and controls a gain of a voice signal based on noise power and a voice power of a voice signal generated by a voice signal generation unit, the voice intelligibility enhancement system comprising:
    a voice power detection unit configured to detect whether the voice power is equal to or greater than a predetermined level;
    a noise power measurement unit configured to measure noise power;
    a noise power storage unit configured to store noise power output when the voice power is less than the predetermined level; and
    a gain control unit configured to control the gain of a voice signal and configured to estimate noise power to be output when the voice power exceeds the predetermined level to be the stored noise power;
    a transmission characteristics identification unit that, in identification mode available when a vehicle is stopped, identifies characteristics of transmission from a speaker that outputs voice to a microphone that detects noise; and
    a transmission characteristics application unit that, in normal operation mode, applies the characteristics of transmission to the voice power to output voice power at a position of the microphone,
    wherein the gain control unit controls gain of a voice signal based on the voice power output from the transmission characteristics application unit and the estimated noise power.

2. The voice intelligibility enhancement system according to claim 1, wherein, in the identification mode, the transmission characteristics identification unit identifies the characteristics of transmission by approximating the characteristics of transmission by gain, and in the normal operation mode, the transmission characteristics application unit multiplies the voice power by the gain to output the voice power at the position of the microphone.

3. The voice intelligibility enhancement system according to claim 2, further comprising:
   a microphone power measurement unit that measures power of a signal detected by the microphone; and
   a simulated voice signal generation unit that generates a simulated voice signal in the identification mode,
   wherein, in the identification mode, the transmission characteristics identification unit measures power of the simulated voice signal output from the simulated voice signal generation unit and identifies the gain from a ratio of the power output from the microphone power measurement unit to the power of the simulated voice signal.

4. The voice intelligibility enhancement system according to claim 3, further comprising:
   a first averaging unit that averages the power of the simulated voice signal for a predetermined time; and
   a second averaging unit that averages the power of the signal detected by the microphone for the predetermined time,
   wherein the transmission characteristics identification unit identifies the gain from a ratio of the average power of the signal detected by the microphone output from the second averaging unit to the average power of the simulated voice signal output from the first averaging unit.

5. The voice intelligibility enhancement system according to claim 2, further comprising:
   a unit that enables and disables operation of the voice intelligibility enhancement system; and
   a unit that, when the operation of the voice intelligibility enhancement system is enabled, checks whether the characteristics of transmission have ever been identified, when the characteristics of transmission have been identified, starts the operation of the voice intelligibility enhancement system, and when the characteristics of transmission have never been identified, prompts a user to determine whether to turn on the identification mode and identify the characteristics of transmission.

6. The voice intelligibility enhancement system according to claim 3, wherein, when the voice signal is a voice signal corresponding to voice uttered by a man, the simulated voice signal generation unit generates a simulated male voice signal, and when the voice signal is a voice signal corresponding to voice uttered by a woman, the simulated voice signal generation unit generates a simulated female voice signal.

7. The voice intelligibility enhancement system according to claim 1, further comprising:
   a mode switching unit that switches between the identification mode and the normal operation mode.

8. The voice intelligibility enhancement system according to claim 1, wherein the noise power storage unit averages, for a predetermined time, the noise power output when the voice power is less than the predetermined level and stores the average noise power.

9. The voice intelligibility enhancement system according to claim 8, wherein the noise power storage unit stores average of noise power for last predetermined time obtained by a moving average method.

* * * * *